June 19, 1962 A. A. HEMPHILL ET AL 3,040,269

TRANSISTOR CONVERTER CIRCUIT UTILIZING DIRECT COUPLED SERIES TRANSISTORS

Filed April 14, 1959

INVENTORS
ALFRED A. HEMPHILL
JOHN M. TEWKSBURY

BY Robert T. Killman
ATTORNEY

United States Patent Office 3,040,269

Patented June 19, 1962

3,040,269

TRANSISTOR CONVERTER CIRCUIT UTILIZING DIRECT COUPLED SERIES TRANSISTORS

Alfred A. Hemphill and John M. Tewksbury, Baltimore County, Md., assignors to The Bendix Corporation, Towson, Md., a corporation of Delaware

Filed Apr. 14, 1959, Ser. No. 806,322

1 Claim. (Cl. 331—113)

This invention relates generally to transistor circuits and particularly to transistor transformer circuits connected in a manner which avoids high voltages being applied across the transistors.

Many circuits are employed at present using transistors and transformers in combination to provide oscillators, amplifiers and power supply converters. In many of these arrangements the connection of the transistor and the transformer is equivalent to a push-pull connection in which the transistors alternately conduct. The non-conducting transistors are often subjected to a voltage higher than the supply voltage due to the autotransformer action of the transformer. While arrangements have been known in the past for avoiding difficulties encountered by over voltages of this type, the problem still exists in many conventional circuits which find wide application.

It is an object of the present invention to provide a transistor circuit which avoids excess voltages across any of the transistors.

Another object of this invention is to provide pushpull transistor circuits connected to transformers with series connected transistors to divide the voltages present in the circuit.

A further object of this invention is to provide series connected transistors in a D.C. converter circuit.

An additional object of this invention is to provide series connected transistors in a push-pull amplifier circuit.

Figure 1:
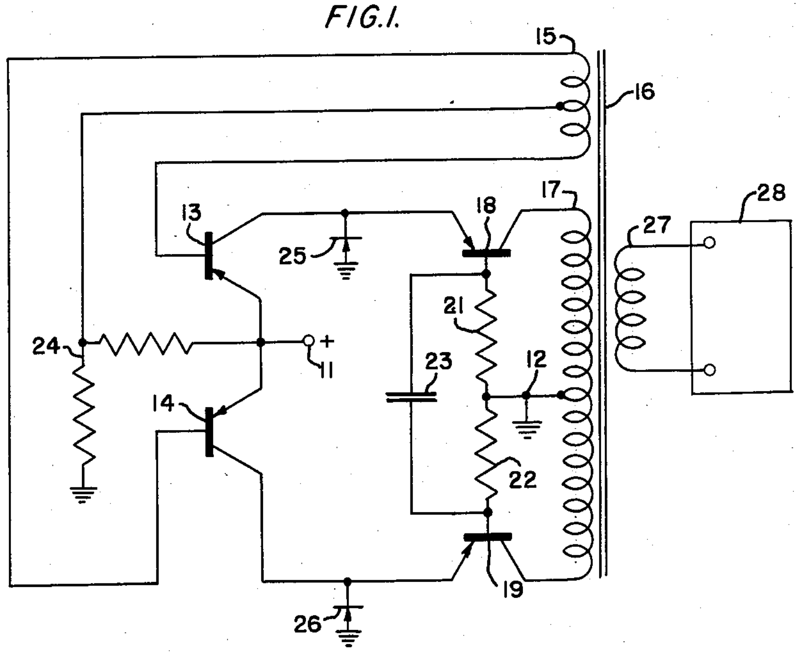
Figure 2:
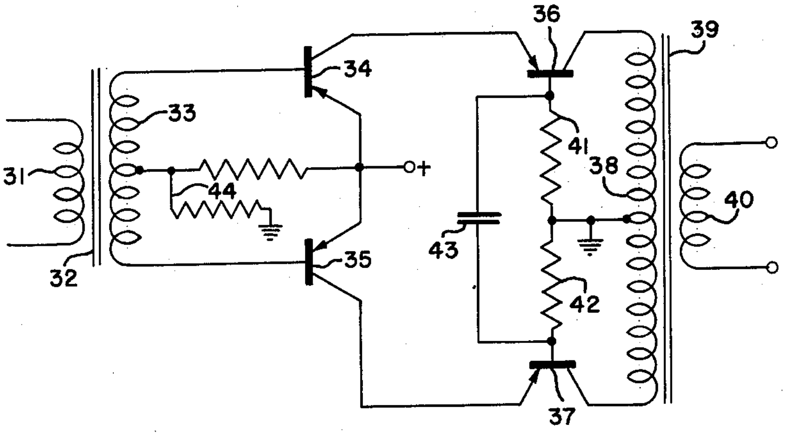

Those and other objects of the invention will be apparent from the following detailed description taken in conjunction with the accompanying drawing wherein FIG. 1 is a schematic circuit diagram of a D.C. converter circuit; and FIG. 2 is a schematic circuit diagram of a push-pull transistor amplifier.

The present invention achieves operation of the transistors within their voltage ratings and with substantial protection against excessive voltages appearing across the transistors in push-pull circuits by connecting a grounded emitter, base driven, amplifying transistor in series with a grounded base transistor in a transformer push-pull circuit in a manner that divides the voltage across the non-conducting half of the circuit between the serially connected transistors.

Referring now to FIG. 1 a converter circuit is shown in which a D.C. source is connected between terminal 11 and ground 12 to supply power to the circuit. The converter circuit comprises what is essentially a push-pull oscillator in which a pair of transistors 13, 14 are base driven from a winding 15 which is on a saturable core transformer 16. A primary winding 17 of the transformer 16 is connected to the collectors of a pair of transistors 18, 19. The bases of transistors 18, 19 are connected to ground through suitable resistors 21, 22 and may be bypassed by a capacitor 23. The emitters of transistors 18, 19 are directly connected to the respective collectors of transistors 13, 14. The emitters of transistors 13, 14 are connected to the positive supply from terminal 11 and to a suitable bias network 24 which is connected to a center tap on winding 15.

The circuit thus described is substantially similar to prior art circuits comprising a saturable square hysterisis loop core transformer 16 and base driven transistors 13 and 14 coupled to pimary winding 17 thereof wherein the prior art coupling has generally been directly from the collectors of the transistors 13, 14 to the respective ends of winding 17. With such a connection the voltage applied at terminal 11 and the induced voltage in the half of winding 17 connected to the non-conducting transistor are additive to produce a voltage aproximately twice the supply voltage between terminal 11 and the appropriate end of winding 17. This condition alternates every half cycle of the oscillation which is sustained in converter circuits of this type. The transistors, therefore, are alternately subjected to a voltage approximately equal to twice the supply voltage across terminals 11, 12.

In accordance with the present invention the grounded base transistors 18, 19 are connected between the collectors of transistors 13, 14 and the respective ends of winding 17. In this manner an efficient coupling is achieved while the collector to emitter path of transistors 18 and 19 are serially connected respectively with the collector-emitter paths of transistors 13, 14. The voltage division thus achieved assures each transistor of a maximum voltage of approximately that of the supply potential applied to terminal 11 and ground. Consequently, for a given voltage rating a power supply may be operated at substantially the rated voltage of the transistors since a double voltage will not appear across any of the transistors. Conversely, for a given supply voltage and factor-of-safety, lower rated voltage transistors can be used. The power dissipation for each transistor is likewise half that which is present in conventional inverter circuits and the circuit may thus be operated at higher ambient temperatures.

In many power supply applications, such as aircraft or other installations involving transient voltages it is often found that transient voltage pulses will appear in converter circuits which lead to breakdown in the transistors and failure of the power supply. In the circuit of FIG. 1 in accordance with the inventions these transients may be eliminated by the addition of rectifiers 25, 26. The rectifiers 25, 26 are not essential to the operation of the circuit and likewise the capacitor 23 may be eliminated although its presence improves the waveshape of the output voltage.

The output from the circuit of FIG. 1 obtained from a secondary winding 27 which may be coupled to any suitable utilization device 28 which may be a rectifier or rectifier-regulator circuit for supplying direct current to the load.

The principles of serial operation of transistors in accordance with the invention in push-pull circuits can be applied to any such circuits where overvoltage is a problem. In FIG. 2 a typical push-pull amplifier such as a Class B amplifier is shown in which input signals are applied to an input winding 31 and coupled in a conventional signal transformer 32 to a push-pull secondary 33. The respective terminals of winding 33 are connected to the bases of transistors 34 and 35. The collectors of transistors 34, 35 are directly connected to the emitters of transistors 36, 37 and the collectors of transistors 36, 37 are connected to respective terminals of a primary winding 38 of output transformer 39 which may be a signal transformer. A secondary winding 40 on transformer 39 supplies amplified signals to any suitable load. The transistors 36, 37 have bases connected through resistors 41, 42 to ground and these resistors may be bypassed by capacitor 43. The transistors 34, 35 are suitably biased by a network 44.

The push-pull Class B amplifier thus described in connection with FIG. 2 provides the same advantages as set forth in connection with the inverter circuit of FIG. 1 in that as the conduction in the transistors 34, 35 alternate with the signal, the over-voltage across the less conducting transistors is divided between the grounded emitter stage and the grounded base stage to avoid over-voltages across any individual transistor. Accordingly, the advantages of using more economical transistors or operating transistors at higher operating levels than would be possible where over-voltages occur are available in the circuit of FIG. 2.

While specific transistor circuits have been shown in the disclosed embodiments it will be understood that the invention can be employed with any suitable type of semiconductor device and the term transistor is to be so interpreted in this specification and appended claim.

While two embodiments of the invention have been disclosed, other applications of the invention will be readily apparent to those skilled in the art. The invention thus may be applied to circuits other than those disclosed and, accordingly, it is to be limited only by the scope of the appended claim.

We claim:

A direct current converter circuit comprising:

a saturable core transformer having a center tapped primary winding and a center tapped feedback winding;

a first pair of transistors connected in grounded base circuit configuration with the collectors thereof connected respectively to the ends of said primary winding and the bases thereof connected through individual resistors to the center tap of said primary winding;

a capacitor connected between the bases of said first pair in shunt with said resistors;

a second pair of transistors connected in grounded emitter circuit configuration with the collectors thereof directly connected to the emitters of said first pair and the bases thereof connected respectively to the ends of said feedback winding;

a direct current source having one pole connected to the emitters of both transistors of said second pair and the other pole connected to the center tap of said primary winding; and means operatively biasing the transistors of said second pair.

References Cited in the file of this patent

UNITED STATES PATENTS

| | | |
|---|---|---|
| 2,832,846 | Waldhauer | Apr. 29, 1958 |
| 2,872,582 | Norton | Feb. 3, 1959 |
| 2,883,479 | Aronson | Apr. 21, 1959 |
| 2,953,754 | Roesel | Sept. 20, 1960 |

FOREIGN PATENTS

| | | |
|---|---|---|
| 764,154 | Great Britain | Dec. 19, 1956 |